US012660135B2

(12) United States Patent
Zhang et al.

(10) Patent No.: US 12,660,135 B2
(45) Date of Patent: Jun. 16, 2026

(54) POWER DISTRIBUTION CABINET AND DIRECT CURRENT POWER DISTRIBUTION SYSTEM FOR ENERGY STORAGE

(71) Applicant: Huawei Digital Power Technologies Co., Ltd., Shenzhen (CN)

(72) Inventors: Xiufeng Zhang, Dongguan (CN); Faming Sun, Dongguan (CN); Binqing Xu, Shanghai (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 130 days.

(21) Appl. No.: 18/514,758

(22) Filed: Nov. 20, 2023

(65) Prior Publication Data

US 2024/0090184 A1      Mar. 14, 2024

Related U.S. Application Data

(63) Continuation of application No. PCT/CN2021/095219, filed on May 21, 2021.

(51) Int. Cl.
| | |
|---|---|
| *H05K 7/00* | (2006.01) |
| *H05K 5/02* | (2006.01) |
| *H05K 7/20* | (2006.01) |

(52) U.S. Cl.
CPC ....... *H05K 7/20909* (2013.01); *H05K 5/0213* (2013.01)

(58) Field of Classification Search
CPC ............. H05K 5/0213; H05K 7/20145; H05K 7/20572; H05K 7/20909; H02B 1/128; H02B 1/565
See application file for complete search history.

(56) References Cited

U.S. PATENT DOCUMENTS

| | | | | | |
|---|---|---|---|---|---|
| 2,187,011 | A | * | 1/1940 | Braden ...................... | H03L 1/04 62/285 |
| 7,205,740 | B1 | * | 4/2007 | Wei .................... | H05K 7/20945 318/434 |
| 2017/0345346 | A1 | * | 11/2017 | Hong ........................ | G09F 9/30 |

FOREIGN PATENT DOCUMENTS

| | | | | | |
|---|---|---|---|---|---|
| CN | 1946279 | A | | 4/2007 | |
| CN | 101873790 | A | | 10/2010 | |
| CN | 108966597 | | * | 12/2018 | |
| CN | 111668725 | A | | 9/2020 | |
| CN | 211790275 | U | | 10/2020 | |
| EP | 1988760 | A1 | * | 11/2008 | ............. G05D 22/02 |

* cited by examiner

*Primary Examiner* — Jonathan Bradford
(74) *Attorney, Agent, or Firm* — Leydig, Voit & Mayer, Ltd.

(57) ABSTRACT

A power distribution cabinet is described which includes a cabinet body, a first air duct assembly, and a second air duct assembly. The first air duct assembly is disposed outside the cabinet body, and the first air duct assembly is disposed on the first side wall of the cabinet body. A projection of the first air duct assembly on the first side wall covers the first air vent and the second air vent. A first circulation space is formed between the first air duct assembly and the first side wall. The first circulation space communicates with an internal space of the cabinet body through the first air vent and the second air vent. The second air duct assembly is disposed inside the cabinet body, and the second air duct assembly forms a second circulation space. The second circulation space communicates with the first air vent.

18 Claims, 12 Drawing Sheets

107

106

1

POWER DISTRIBUTION CABINET AND DIRECT CURRENT POWER DISTRIBUTION SYSTEM FOR ENERGY STORAGE

CROSS-REFERENCE TO RELATED APPLICATIONS

This application is a continuation of International Application No. PCT/CN2021/095219, filed on May 21, 2021, the disclosure of which is hereby incorporated by reference in its entirety.

TECHNICAL FIELD

This application relates to the field of energy technologies, and in particular, to a power distribution cabinet and a direct current power distribution system for energy storage.

BACKGROUND

In a current direct current power distribution system for energy storage, current distribution is usually performed between a power conversion system (PCS) and a battery by using one or more loops. Each loop between the PCS and the battery may be connected and disconnected by using a protection unit, to facilitate maintenance or disconnection of the loop when a fault occurs. The protection unit may be a loop disconnector combined with a fuse, or may be a circuit breaker. There are a relatively large quantity of loops. Therefore, to save a space and facilitate installation and subsequent maintenance, a plurality of protection units and loop wiring copper bars are usually installed together in a same cabinet structure to form a power distribution cabinet. However, due to a relatively large quantity of loops and a relatively high loop current, there is relatively high heat consumption in the power distribution cabinet. If heat in the power distribution cabinet cannot be effectively dissipated, there is excessive temperature rise of a protective device, which increases a probability of a misoperation such as thermal tripping. In addition, long-term over-temperature running affects a service life of a component, and increases a failure risk of the component.

SUMMARY

This application provides a power distribution cabinet and a direct current power distribution system for energy storage, to meet a temperature control requirement of an internal component and reduce intrusion of external dirt into the internal component.

According to a first aspect, this application provides a power distribution cabinet, including a cabinet body, a first air duct assembly, and a second air duct assembly. A first air vent and a second air vent are disposed on a first side wall of the cabinet body. The first air duct assembly is disposed outside the cabinet body, and the first air duct assembly is disposed on the first side wall of the cabinet body. A projection of the first air duct assembly on the first side wall covers the first air vent and the second air vent. A first circulation space is formed between the first air duct assembly and the first side wall. The first circulation space communicates with an external environment, and the first circulation space communicates with an internal space of the cabinet body through the first air vent and the second air vent. The second air duct assembly is disposed inside the cabinet body, and the second air duct assembly forms a second circulation space. The second circulation space communicates with the first air vent to communicate with the first circulation space. The second air duct assembly is provided with a ventilation opening. The second circulation space communicates with the internal space of the cabinet body through the ventilation opening, and a cooling fan is disposed at the ventilation opening.

According to the technical solution provided in this application, forced air cooling inside the cabinet body may be implemented by using the cooling fan, so that external cold air flows into the cabinet body from the first air vent, and hot air inside the cabinet body flows out of the cabinet body from the second air vent, to accelerate air flow inside the cabinet body. In addition, the first air duct assembly is disposed to basically limit natural convection between the hot air inside the cabinet body and the cold air from the external environment to the first circulation space, to reduce entry of external dust and dirt into the cabinet body. In this way, a heat dissipation effect of an internal component can be ensured to resolve a problem of difficulty in heat dissipation in the power distribution cabinet with high heat consumption, and dust intrusion caused due to direct ventilation can be reduced to effectively protect the internal component. In addition, only the cooling fan is a heat dissipation device that needs to be actively driven, and relatively low power consumption is caused due to heat dissipation. The first air duct assembly and the second air duct assembly have relatively simple structures, and do not need to be actively driven. Naturally, no wiring needs to be performed. This facilitates processing and installation, and lowers costs.

In an exemplary implementable solution, the first air duct assembly includes a substrate and a protrusion part; the substrate has a first side disposed facing the first side wall; and the protrusion part is disposed on the first side of the substrate, the protrusion part extends in a direction from the first air vent to the second air vent, there are at least two protrusion parts, and the at least two protrusion parts are disposed at intervals. Adjacent protrusion parts, the substrate, and the first side wall of the cabinet body jointly form the first circulation space, and natural convection between the hot air inside the cabinet body and the cold air from the external environment is performed in the first circulation space, to dissipate heat inside the cabinet body. The first air duct assembly has a simple structure, and is easy to be installed on the cabinet body without changing a structure of the cabinet body or affecting normal use of the cabinet body.

When the first air duct assembly is disposed, the protrusion part presses against the first side wall. The first air duct assembly is easy to be installed on the cabinet body, and the first air duct assembly occupies a relatively small space, so that the cabinet body is easy to be placed.

In addition to the foregoing manner of disposing the first air duct assembly, another manner may be used. For example, there is a gap between the protrusion part and the first side wall. This increases an air circulation range, can improve efficiency of heat exchange between hot and cold air, and accelerates heat dissipation inside the cabinet body.

When the protrusion part is disposed, the protrusion part is in a column shape or an arch shape; or the protrusion part is in a plate shape, and the protrusion part in the plate shape is perpendicular to the substrate. The protrusion part has a relatively simple structure, which facilitates processing of the first air duct assembly as a whole and facilitates cost control.

In an exemplary implementable solution, the first air vent and the second air vent are disposed at intervals in a vertical direction. The first air vent may be disposed close to a top wall of the cabinet body, and the second air vent may be disposed close to a bottom wall of the cabinet body, so that air can be blown from top to bottom inside the cabinet body. There is a relatively large air flow range, and a relatively ideal cooling effect is achieved.

In an exemplary implementable solution, each of the first air vent and the second air vent is in a long strip shape, the second air vent and the first air vent are disposed in parallel, and the first air vent extends in a horizontal direction on the first side wall of the cabinet body. The first air vent and the second air vent have relatively large ventilation areas, and a ventilation range crosses the cabinet body, to accelerate air flow inside the cabinet body, so as to accelerate heat dissipation inside the cabinet body.

In an exemplary implementable solution, the second air duct assembly includes a first plate body and a second plate body that are connected to each other, the first plate body and the second plate body form the second circulation space with an inner wall of the cabinet body, and the ventilation opening is disposed on the first plate body. The second circulation space may implement air circulation inside and outside the cabinet body. The second air duct assembly has a relatively simple structure, and is easy to be installed inside the cabinet body. In addition, the second air duct assembly is disposed, so that it is relatively convenient to install the cooling fan. In addition, the second air duct assembly may block and temporarily store external dirt. Compared with an operation of cleaning the internal space of the cabinet body, a component in the cabinet body, and the like, it is more convenient to regularly clean the second air duct assembly, to facilitate overall maintenance of the power distribution cabinet.

When the second air duct assembly is disposed, the first plate body is horizontally disposed, a first side edge of the first plate body is connected to the first side wall of the cabinet body, and the second plate body is connected to a second side edge that is of the first plate body and that is opposite to the first side edge. The cooling fan is disposed on the first plate body, and the first plate body is horizontally disposed, so that the cooling fan can blow air from top to bottom. There is a relatively large air flow range, and a relatively large quantity of heat generation components can be cooled, to accelerate heat dissipation inside the cabinet body.

In an exemplary implementable solution, the power distribution cabinet further includes a thermally conductive plate, the thermally conductive plate is disposed on the first side wall, and the thermally conductive plate is located between the first side wall and the first air duct assembly. The thermally conductive plate is disposed to accelerate heat dissipation inside the cabinet body.

In an exemplary implementable solution, the power distribution cabinet further includes a direct current busbar and an auxiliary circuit board electrically connected to the direct current busbar; a temperature sensor is disposed inside the cabinet body, and the temperature sensor is configured to detect a temperature inside the cabinet body; and a direct current (DC)/DC power supply circuit and a control circuit are disposed on the auxiliary circuit board, the DC/DC power supply circuit is configured to: isolate and transform an output voltage of the direct current busbar, and output the output voltage, and the control circuit is electrically connected to the DC/DC power supply circuit, the temperature sensor, and the cooling fan, and is configured to: receive a detection signal from the temperature sensor, and control a rotation speed of the cooling fan based on the detection signal. The cooling fan may obtain power from the auxiliary circuit board, that is, may obtain power from the direct current busbar inside the cabinet body, and requires no external power supply. This can lower a requirement of a heat dissipation device on a power supply system, simplify wiring, and lower heat dissipation costs. The temperature sensor detects the temperature inside the cabinet body, and the control circuit controls the rotation speed of the cooling fan, to automatically adjust the temperature inside the cabinet body.

According to a second aspect, this application provides a direct current power distribution system for energy storage, including a power conversion system, a direct current energy storage apparatus, and the foregoing power distribution cabinet. The power conversion system is configured to perform alternating current/direct current conversion on electric energy. The direct current energy storage apparatus is configured to store or release direct current energy. The power distribution cabinet is connected between the power conversion system and the direct current energy storage apparatus, and is configured to perform current distribution.

According to the technical solution provided in this application, the power distribution cabinet performs current distribution between the power conversion system and the direct current energy storage apparatus. When there is relatively high heat consumption, the power distribution cabinet still has a relatively high heat dissipation capability, works stably, has a long service life, and is easy to maintain. Therefore, working stability of the direct current power distribution system for energy storage is improved.

5

Figure 13:
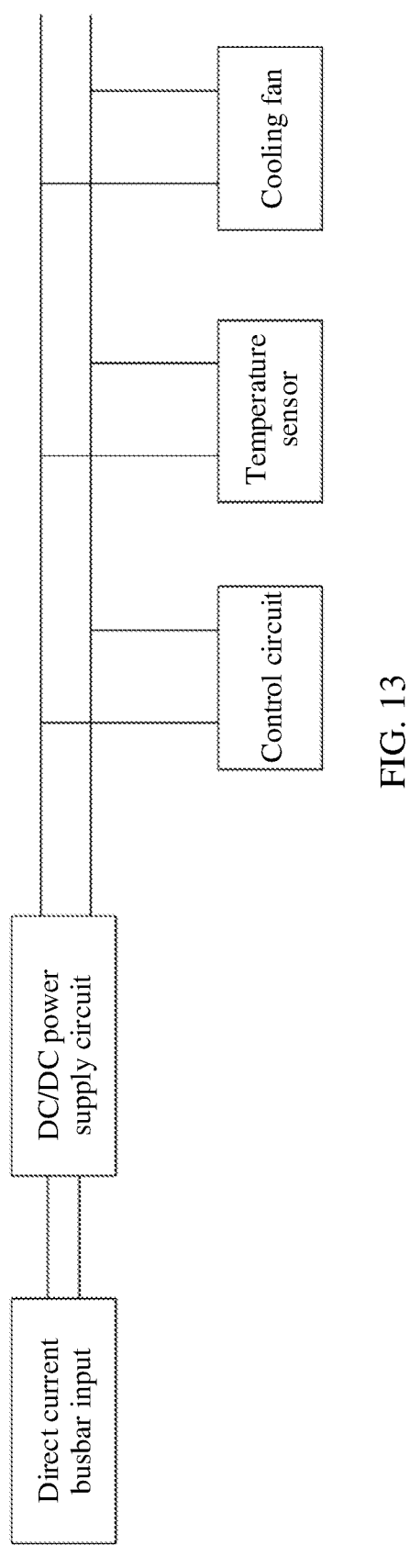

FIG. 13 is a schematic diagram of an electrical principle of an auxiliary circuit board of a power distribution cabinet according to an embodiment of this application.

REFERENCE NUMERALS

100: Cabinet body; 200: First air duct assembly; 300: Second air duct assembly; 400: Thermally conductive plate; 500: Cover;

101: First air vent; 102: Second air vent; 103: First side wall; 104: Second side wall; 105: Top wall;

106: Third side wall; 107: Door structure; 201: First circulation space; 202: Substrate; 203: Protrusion part; 301: Ventilation opening; and

302: Cooling fan; 303: First plate body; 304: Second plate body; 305: Second circulation space.

DESCRIPTION OF EMBODIMENTS

The following describes in detail embodiments of this application with reference to accompanying drawings.

For ease of understanding, an application scenario of a power distribution cabinet in embodiments of this application is first described. The power distribution cabinet provided in embodiments of this application may be adapted to a direct current power distribution system for energy storage, and may be connected between a power conversion system and a direct current energy storage apparatus to perform current distribution. The power conversion system performs alternating current/direct current conversion on electric energy, and may be connected to a power grid. The direct current energy storage apparatus stores or releases direct current energy. In an existing direct current power distribution system for energy storage, there is relatively high heat consumption in a power distribution cabinet due to a relatively large quantity of loops between a power conversion system and a direct current energy storage apparatus and a relatively high loop current. Therefore, an effective heat dissipation means needs to be configured to ensure normal running of an electrical component in the power distribution cabinet.

Currently, a commonly used heat dissipation means is to dispose a cooling fan inside the cabinet and dispose a ventilation hole on a cabinet panel, to improve air flow inside the cabinet, so that hot air inside the cabinet is continuously circulated and exchanged with external cold air to implement cooling. In this means, to ensure a heat dissipation effect, the cooling fan needs to have relatively high power and a relatively high rotation speed. In this case, external dust, greasy dirt, harmful gas, and the like are prone to be introduced into the cabinet, and adsorbed by static electricity on surfaces of a component and a cable. As time goes by, there is a risk that the component and the cable are corroded, and heat dissipation of the component is affected. In addition, after being dampened, accumulated dust is prone to cause a high-voltage part of a circuit board to be short-circuited. Furthermore, most of such cooling fans are direct current fans with a rated voltage less than 48 V, have an excessively large voltage difference from a high-voltage side of the power distribution cabinet, and cannot directly obtain power from the high-voltage side of the power distribution cabinet. In this case, a separate low-voltage direct current part needs to be obtained from the power distribution system, to implement power supply. This increases system complexity and a quantity of cables, and increases costs. Another heat dissipation means is to use a natural ventilation cabinet and dispose, by using a principle of natural convection between cold and hot air, an air duct to guide convection between cold air outside the cabinet and hot air inside the cabinet. No additional fan needs to be disposed, but there is a limited heat dissipation capability. When the power distribution cabinet has relatively high power and heat consumption, a cooling effect cannot be ensured, and there is a relatively high requirement for insulation and heat resistance of a component and a cable. Consequently, there is an increase in costs.

Based on this, embodiments of this application provide a power distribution cabinet, to meet a temperature control requirement of an internal component of the power distribution cabinet, reduce a risk that external dirt intrudes into the internal component, and improve working reliability of the power distribution cabinet.

Figure 1:
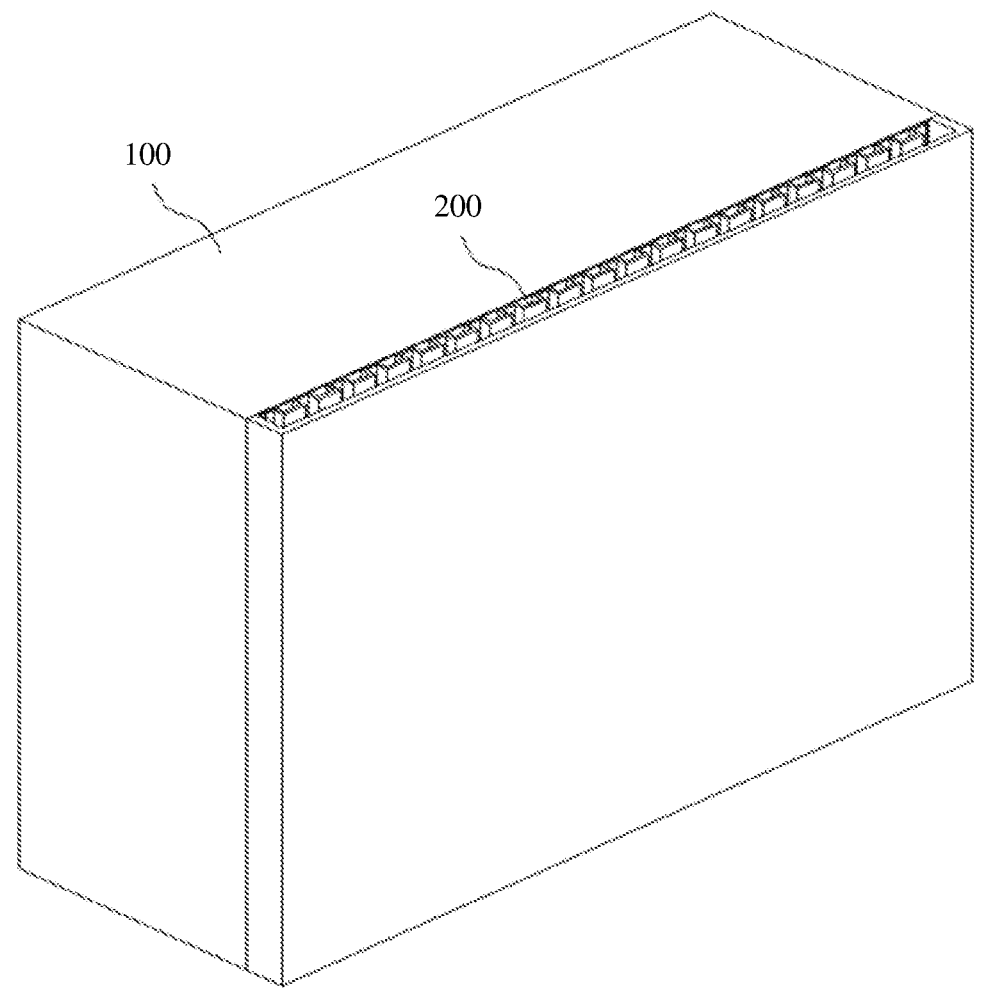
FIG. 1 is a schematic diagram of a three-dimensional structure of a power distribution cabinet according to an embodiment of this application.

FIG. 1 is a schematic diagram of a three-dimensional structure of a power distribution cabinet according to an embodiment of this application. Referring to FIG. 1, the power distribution cabinet may include a cabinet body 100 and a first air duct assembly 200. There is an accommodation space inside the cabinet body 100, and a component, a cable, and the like may be disposed in the accommodation space. The component may include a loop wiring copper bar, a direct current busbar, a protection unit, and the like. The first air duct assembly 200 may be disposed outside the cabinet body 100, and the first air duct assembly 200 communicates with the accommodation space of the cabinet body 100. In addition, the first air duct assembly 200 communicates with an external environment, and air flow exchange is performed between an inside of the cabinet body 100 and the external environment through the first air duct assembly 200.

Figure 2:
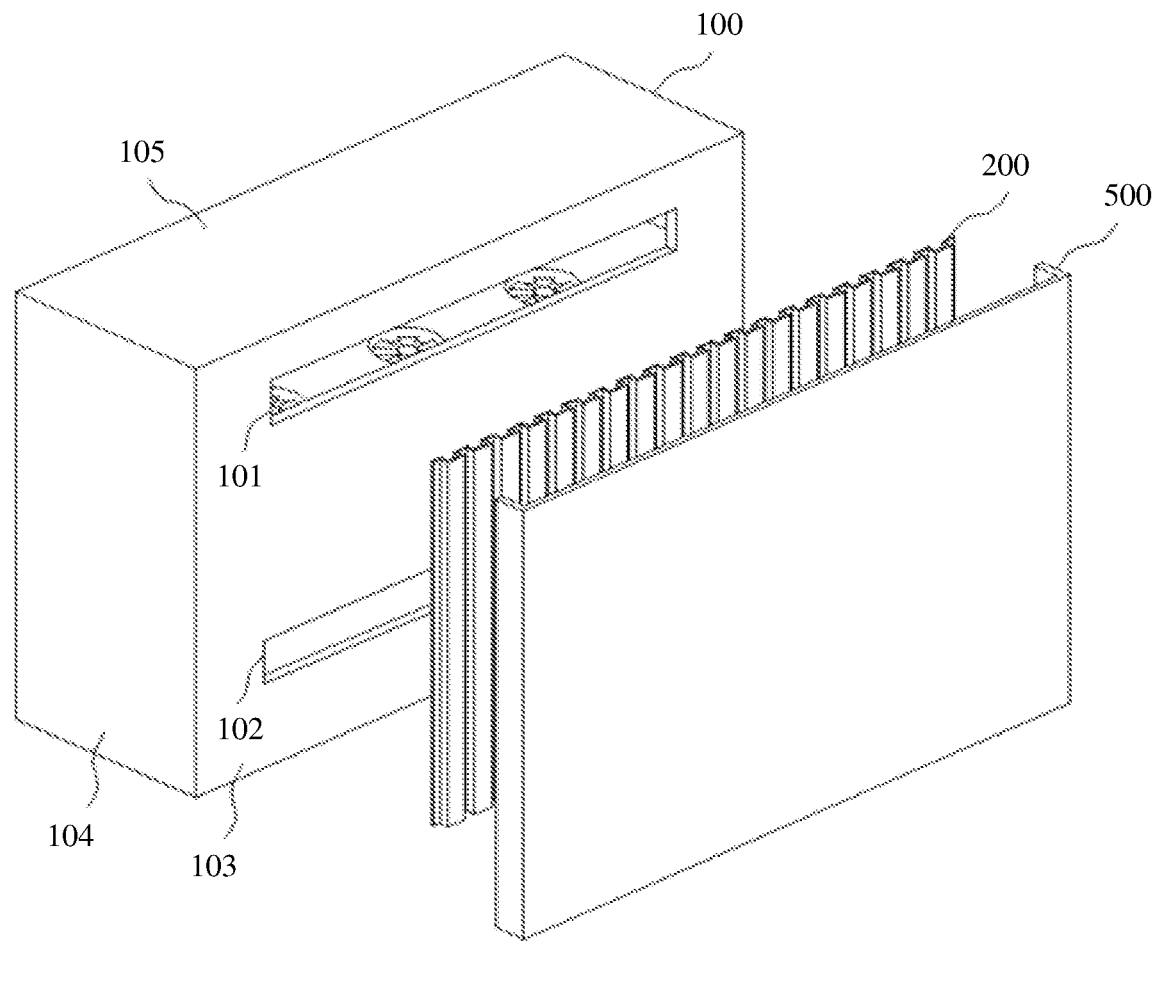
FIG. 2 is a schematic diagram of a split structure of a power distribution cabinet according to an embodiment of this application.

FIG. 2 is a schematic diagram of a split structure of a power distribution cabinet according to an embodiment of this application. Referring to FIG. 2, the cabinet body 100 may be approximately of a hexahedron structure, and the cabinet body 100 may include a first side wall 103, a second side wall 104, a third side wall, a fourth side wall, a top wall 105, and a bottom wall. Each of the first side wall 103, the second side wall 104, the third side wall, and the fourth side wall is connected between the top wall 105 and the bottom wall, the first side wall 103 and the third side wall may be two opposite side walls, and the second side wall 104 and the fourth side wall may be two opposite side walls. For example, the first side wall 103 may be a backplane of the cabinet body 100, the second side wall 104 may be a left side panel of the cabinet body 100, the third side wall may be a front panel of the cabinet body 100, and the fourth side wall may be a right side wall of the cabinet body 100. It should be noted that the orientation terms "left", "right", "top", and "bottom" used for the cabinet body 100 in this embodiment of this application are mainly intended for description based on a display orientation of the cabinet body 100 in FIG. 2, and do not constitute a limitation on an orientation of the cabinet body 100 in an actual application scenario.

A first air vent 101 and a second air vent 102 may be disposed at intervals in a vertical direction. In this case, the first air vent 101 may be disposed close to the top wall of the cabinet body 100, and the second air vent 102 may be disposed close to the bottom wall of the cabinet body 100. When heat generation components inside the cabinet body 100 are mainly distributed in the middle of the cabinet body 100, the second air vent 102 may be disposed relatively close to the middle of the cabinet body 100.

During an exemplary implementation, the first air vent 101 may be of a long-strip structure extending in a horizontal direction, and may be a long-strip rectangle, an elliptical shape, a runway shape, or the like. Similarly, the second air vent 102 may be a rectangle, an elliptical shape, a runway shape, or the like similar to the first air vent 101. Alternatively, the first air vent 101 and the second air vent 102 may be in another shape, for example, a wave shape or a honeycomb shape.

The second air vent 102 may also extend in a horizontal direction on the first side wall 103 of the cabinet body 100, and the extension direction of the second air vent 102 may be parallel to that of the first air vent 101. With reference to shape consideration, for example, when both the first air vent 101 and the second air vent 102 are in the long strip shape, a long edge of the first air vent 101 may be parallel to a long edge of the second air vent 102; when both the first air vent 101 and the second air vent 102 are in the elliptical shape, a long axis of the first air vent 101 may be parallel to a long axis of the second air vent 102; or when both the first air vent 101 and the second air vent 102 are in the wave shape, the extension direction of the first air vent 101 may be parallel to the extension direction of the second air vent 102.

There may be a plurality of first air vents 101, and the plurality of first air vents 101 may be arranged at intervals in the horizontal direction. Similarly, there may be a plurality of second air vents 102, and the plurality of second air vents 102 may be arranged at intervals in the horizontal direction.

To reduce intrusion of external dirt into the cabinet body 100, a mesh structure may be disposed on each of the first air vent 101 and the second air vent 102 to block some dirt. In addition, the mesh structure may be made of a material with an adsorption property, to more effectively block the dirt by using an adsorption effect of the mesh structure.

The first air duct assembly 200 may be disposed outside the cabinet body 100. For example, the first air duct assembly 200 may be disposed on the first side wall 103 of the cabinet body 100, a first end of the first air duct assembly 200 may extend to the top wall of the cabinet body 100, and a second end of the first air duct assembly 200 may extend to the bottom wall of the cabinet body 100. The first air vent 101 and the second air vent 102 may be disposed on the first side wall 103, and an internal space of the cabinet body 100 communicates with the first air duct assembly 200 through the first air vent 101 and the second air vent 102. The first air vent 101 and the second air vent 102 may be located in a projection region of the first air duct assembly 200 on the first side wall 103, that is, the first air duct assembly 200 may cover the first air vent 101 and the second air vent 102.

In an exemplary implementation, a cover 500 may be further disposed outside the cabinet body 100. The cover 500 may be disposed on the first side wall 103 of the cabinet body 100, and the cover 500 may cover the first air duct assembly 200 to protect the first air duct assembly 200. In addition, two ends of the cover 500 respectively correspond to the first end and the second end of the first air duct assembly 200 and have openings, which does not prevent the first air duct assembly 200 from communicating with the external environment.

Figure 3:
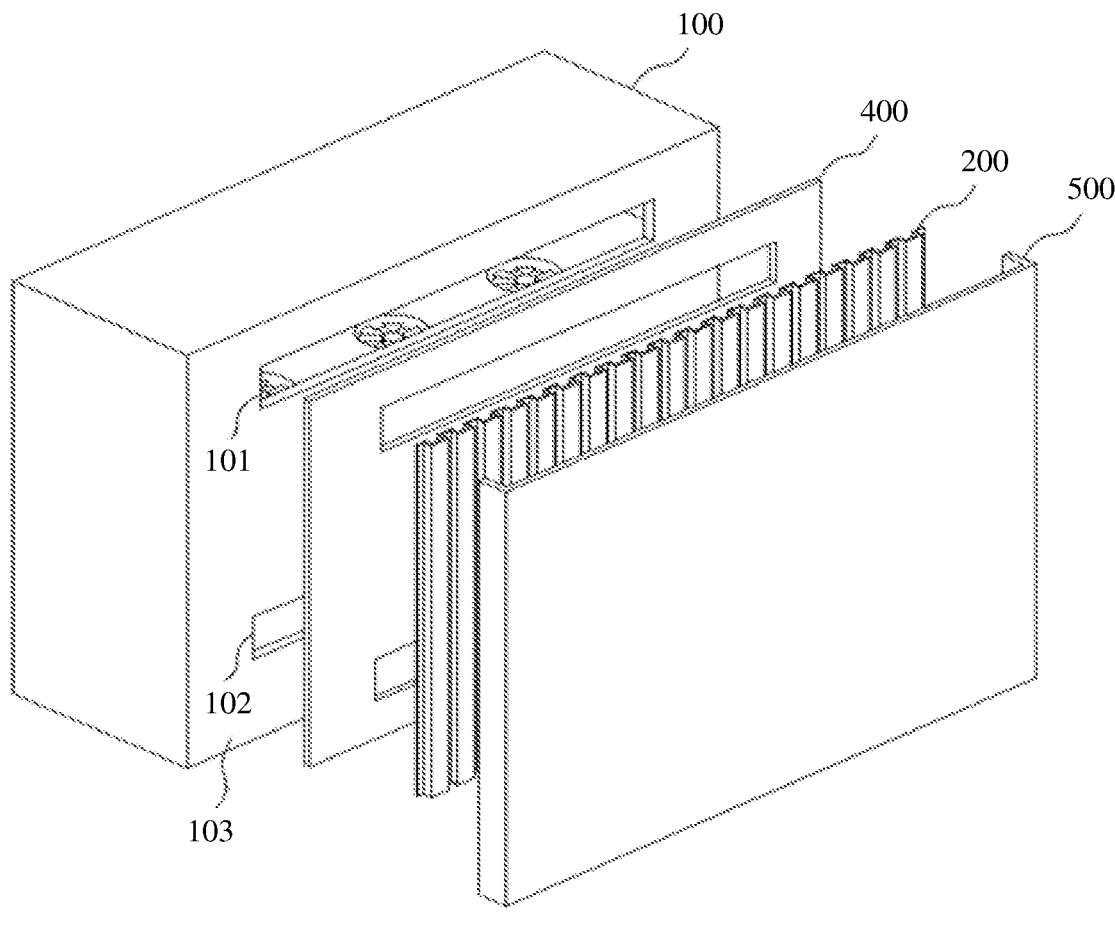
FIG. 3 is a schematic diagram of a split structure of a power distribution cabinet according to another embodiment of this application.

FIG. 3 is a schematic diagram of a split structure of a power distribution cabinet according to another embodiment of this application. Referring to FIG. 3, in an exemplary implementation, a thermally conductive plate 400 may be disposed outside the cabinet body 100. The thermally conductive plate 400 may be disposed on the first side wall 103 of the cabinet body 100, and the thermally conductive plate 400 is located between the first side wall 103 of the cabinet body 100 and the first air duct assembly 200. The thermally conductive plate 400 may be made of aluminum foil or another material with relatively ideal heat dissipation performance, to accelerate heat dissipation inside the cabinet body 100. The thermally conductive plate 400 may cover the entire first side wall 103 of the cabinet body 100 or a part of the first side wall 103. When covering the first side wall 103 of the cabinet body 100, the thermally conductive plate 400 may also cover other side walls of the cabinet body 100, for example, side walls on left and right sides of the first side wall 103 and the top wall. During an exemplary implementation, a thickness of the thermally conductive plate 400 may range from 0.2 mm to 0.8 mm, for example, 0.2 mm, 0.5 mm, or 0.8 mm. It should be noted that when the thermally conductive plate 400 covers positions of the first air vent 101 and the second air vent 102, openings may be disposed at positions corresponding to the first air vent 101 and the second air vent 102 on the thermally conductive plate 400, to avoid the first air vent 101 and the second air vent 102, and ensure normal air circulation inside and outside the cabinet body 100.

Figure 4:
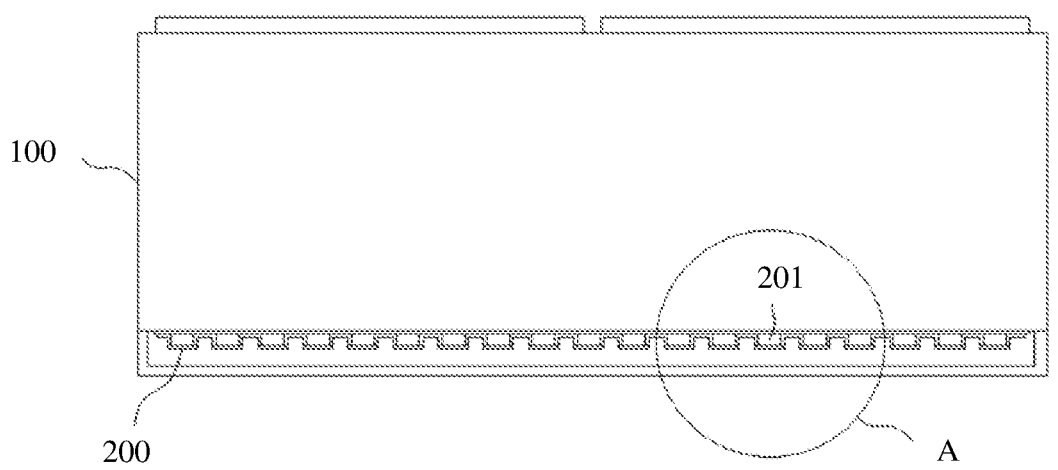
FIG. 4 is a schematic diagram of a top-view structure of a power distribution cabinet according to an embodiment of this application.

FIG. 4 is a schematic diagram of a top-view structure of a power distribution cabinet according to an embodiment of this application. Referring to FIG. 2 and FIG. 4, there is a gap between the first air duct assembly 200 and the first side wall 103, so that a first circulation space 201 may be formed between the first air duct assembly 200 and the first side wall 103. There are openings at the two ends of the first air duct assembly 200, and the first circulation space 201 may communicate with the external environment. The first air duct assembly 200 covers the first air vent 101 and the second air vent 102, and the internal space of the cabinet body 100 may communicate with the first circulation space 201 through the first air vent 101 and the second air vent 102, to communicate with the external environment through the first circulation space 201. Specifically, gas may be circulated between the internal space of the cabinet body 100 and the external environment through the first air vent 101 and the first circulation space 201, and gas may be circulated between the internal space of the cabinet body 100 and the external environment through the second air vent 102 and the first circulation space 201.

Figure 5:
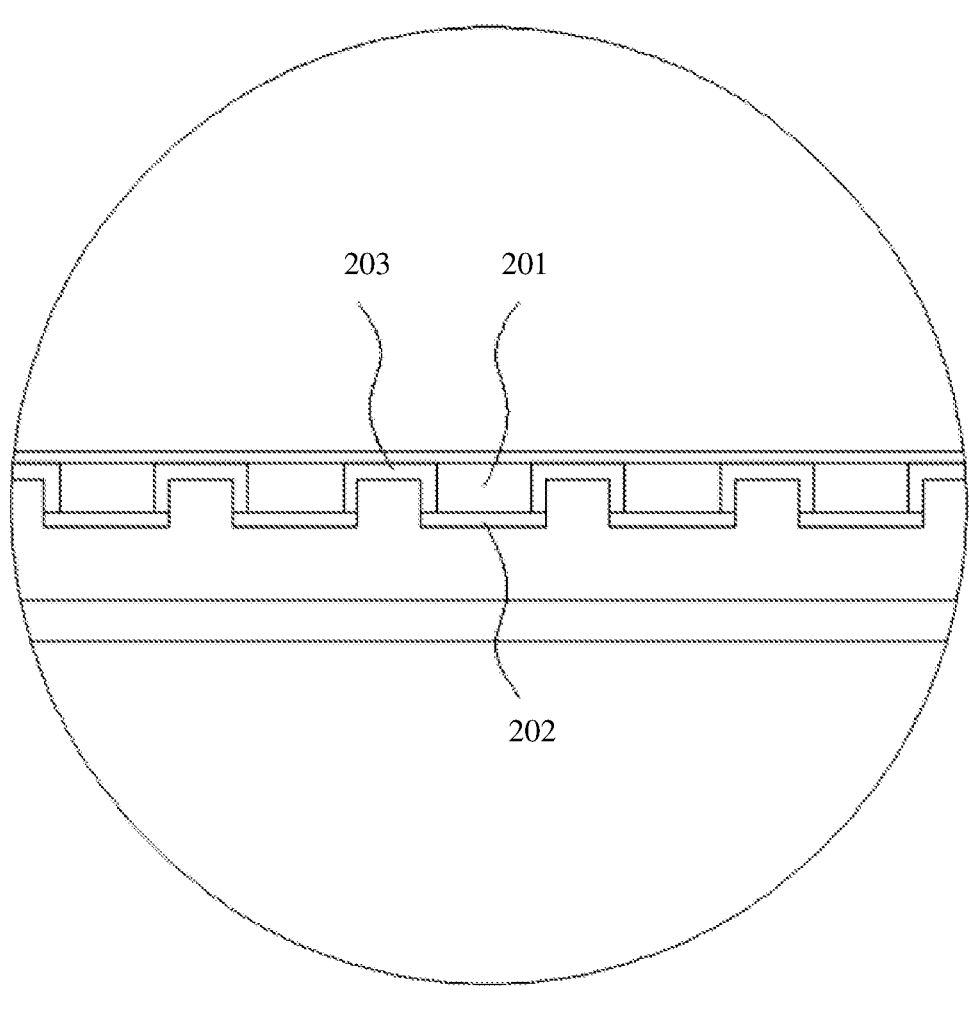
FIG. 5 is an enlarged view of a structure at A in FIG. 4.

FIG. 5 is an enlarged view of a structure at A in FIG. 4. Referring to FIG. 5, the first air duct assembly includes a substrate 202 and a protrusion part 203. A first side of the substrate 202 may be disposed facing the first side wall of the cabinet body, and the protrusion part 203 may be disposed on the first side of the substrate 202, that is, the protrusion part 203 faces the first side wall of the cabinet body. There may be at least two protrusion parts 203. The at least two protrusion parts 203 are disposed at intervals, and adjacent protrusion parts 203, the substrate 202, and the first side wall of the cabinet body jointly form the first circulation space 201. Generally, there may be a plurality of substrates 202. The protrusion parts 203 and the substrates 202 of the first air duct assembly are alternately arranged and connected to each other, a channel is formed between the adjacent protrusion parts 203, openings are formed at the two ends of the first air duct assembly, and each channel communicates with the external environment, so that the first circulation space 201 communicates with the external environment.

For example, there are n protrusion parts 203, where n≥2. In this case, the n protrusion parts 203 may form n−1 first circulation spaces 201 in the extension direction of the first air vent, and any first circulation space 201 may be used to perform natural convection between hot air flowing out of the cabinet body and cold air from the external environment.

It may be understood that when a thermally conductive plate is disposed between the first air duct assembly and the first side wall of the cabinet body, the adjacent protrusion parts 203, the substrate 202, and the thermally conductive plate jointly form the first circulation space 201.

In an exemplary implementation, the at least two protrusion parts 203 may be disposed at intervals in the extension direction of the first air vent, and each protrusion part 203 may extend in a direction from the first air vent to the second air vent. For example, when the first air vent extends in the horizontal direction, and the first air vent and the second air vent are arranged in the vertical direction, the at least two protrusion parts 203 may be arranged at intervals in the horizontal direction, and each protrusion part 203 may extend in the vertical direction. Gas may be circulated between the internal space of the cabinet body and the external environment through the first air vent and the first circulation space 201, gas may be circulated between the internal space of the cabinet body and the external environment through the second air vent and the first circulation space 201, and natural convection between the hot air flowing out of the cabinet body and the cold air from the external environment is performed in the first circulation space 201, to implement air circulation inside and outside the cabinet body, so as to dissipate heat inside the cabinet body.

During an exemplary implementation, the substrate 202 and the protrusion part 203 may be made of a same material. For example, both the substrate 202 and the protrusion part 203 may be made of a metal material. When the entire first air duct assembly is made of a metal material, heat dissipation can be accelerated from a material level. From a structural level, design of the protrusion part 203 can increase an overall heat dissipation area of the first air duct assembly, and further can accelerate heat dissipation.

In some embodiments, the protrusion part 203 may press against the first side wall. In this case, two adjacent protrusion parts 203, the first side wall 103 of the cabinet body, and the substrate 202 may jointly form the first circulation space 201 with openings at two ends through enclosing, and naturally convection between cold and hot air is performed in the first circulation space 201.

Figure 6:
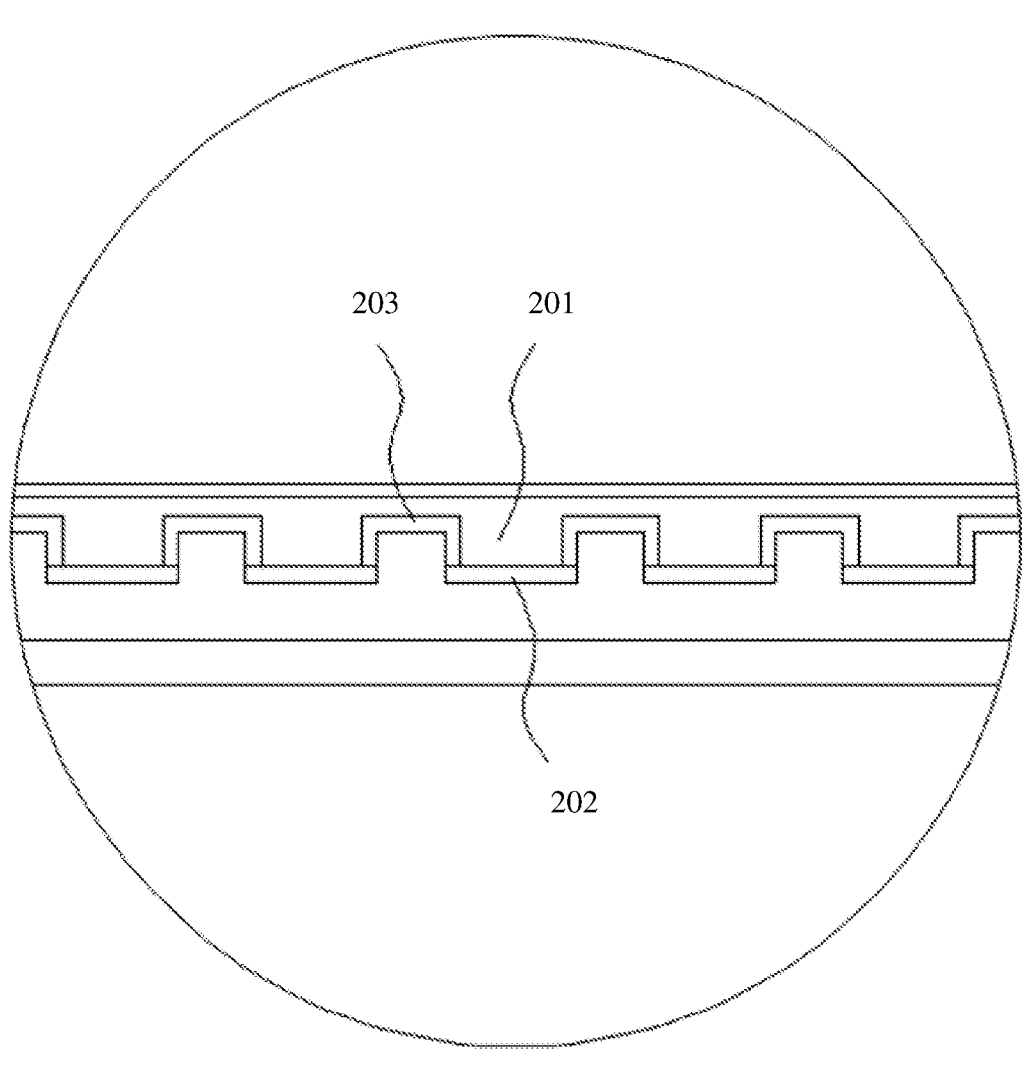
FIG. 6 is a schematic diagram of a structure of a first air duct assembly of a power distribution cabinet according to an embodiment of this application.

FIG. 6 is a schematic diagram of a structure of a first air duct assembly of a power distribution cabinet according to an embodiment of this application. Referring to FIG. 6, there may be a small gap between the protrusion part 203 and the first side wall. The adjacent protrusion parts 203, the first side wall of the cabinet body, and the substrate 202 jointly form the first circulation space 201 with openings at two ends and a slit at a side edge through enclosing. Natural convection between cold and hot air may be performed in the first circulation space 201, or may be performed in the gap between the protrusion part 203 and the first side wall. In this case, an air circulation range can be increased to some extent. Therefore, efficiency of heat exchange between the cold and hot air can be improved. With respect to structural design of the first air duct assembly, heights at which the plurality of protrusion parts 203 protrude from the substrate 202 may be the same, that is, top ends of the plurality of protrusion parts 203 may be completely flush with each other, or heights at which the plurality of protrusion parts 203 protrude from the substrate 202 may be different. This may be adaptively set based on an actual heat dissipation requirement and a structure status of the first side wall.

It may be understood that when a thermally conductive plate is disposed between the first air duct assembly and the first side wall of the cabinet body, there may be a small gap between the protrusion part 203 and the thermally conductive plate.

Referring to FIG. 5 again, in some embodiments, the protrusion part 203 may be in a shape that is similar to an arch shape and in which three structures in a plate shape are sequentially connected and there are two corner angles. Two structures in the plate shape are parallel, and the other structure in the plate shape is connected between the two structures in the plate shape. In addition, the arch shape may be an arch shape for which smooth transition is implemented.

Figure 7:
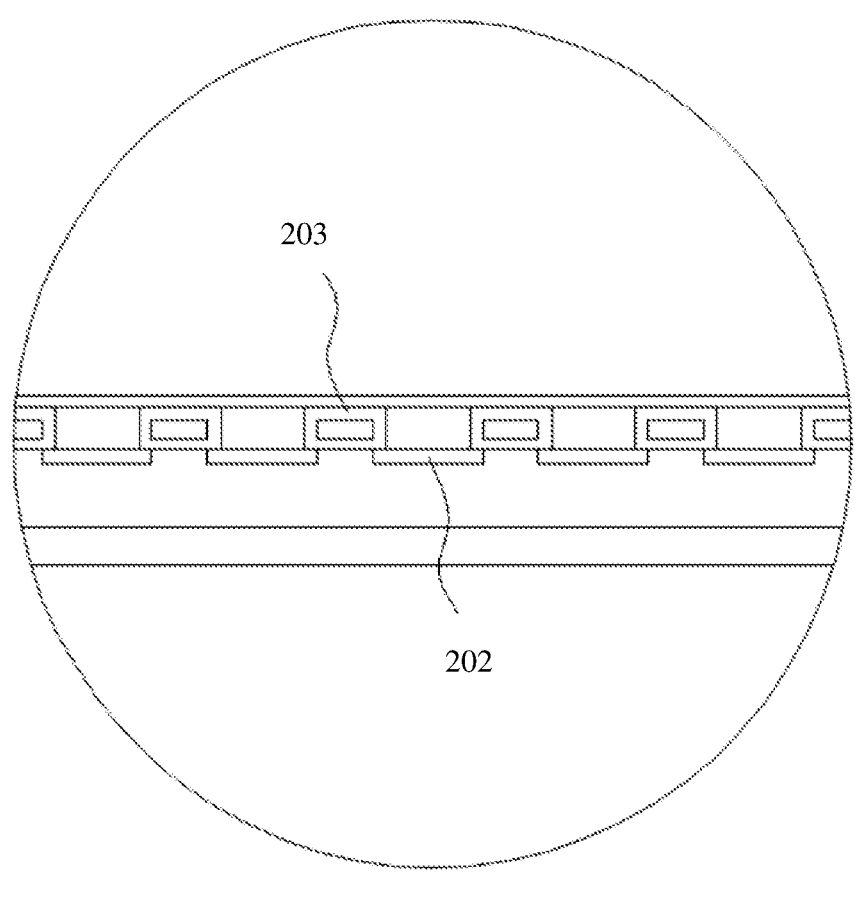
FIG. 7 is another schematic diagram of a structure of a first air duct assembly of a power distribution cabinet according to an embodiment of this application.

FIG. 7 is another schematic diagram of a structure of a first air duct assembly of a power distribution cabinet according to an embodiment of this application. Referring to FIG. 7, the protrusion part 203 may be in a column shape, and the protrusion part 203 in the column shape may be in a rectangular column or square column shape formed by sequentially connecting four structures in a plate shape. In addition, the protrusion part 203 in the column shape may alternatively be in a triangular prism shape formed by sequentially connecting three structures in a plate shape, or the protrusion part 203 in the column shape may alternatively be in a prism shape formed by sequentially connecting at least four structures in a plate shape. A plurality of structures in the plate shape may be assembled to form the protrusion part 203 in the column shape, and then the protrusion part 203 is connected to the substrate 202.

Figure 8:
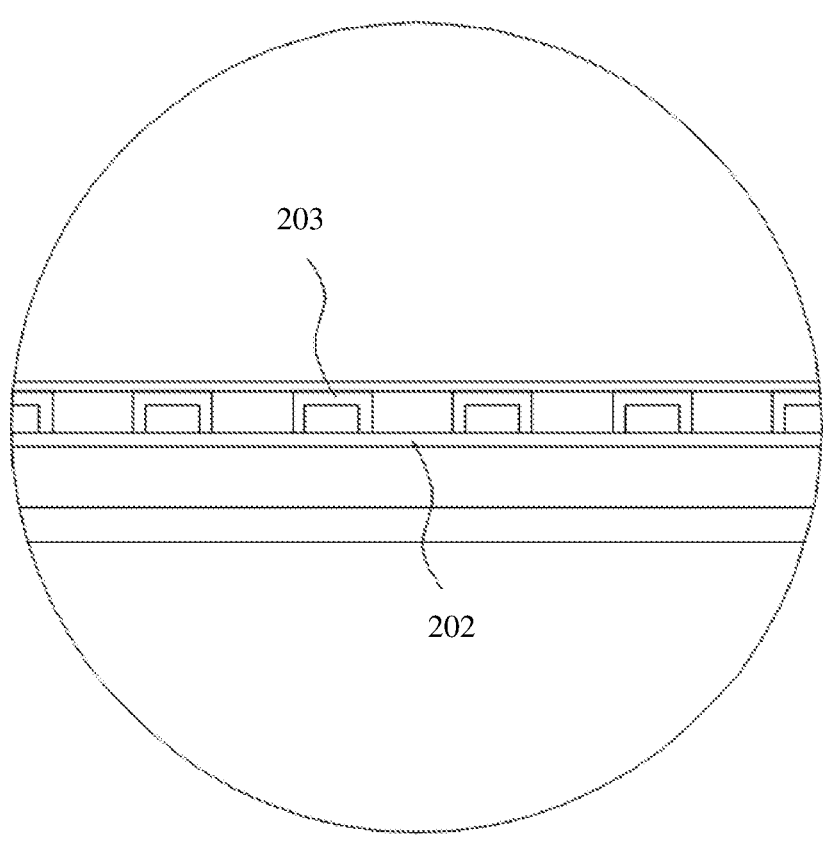
FIG. 8 is still another schematic diagram of a structure of a first air duct assembly of a power distribution cabinet according to an embodiment of this application.

FIG. 8 is still another schematic diagram of a structure of a first air duct assembly of a power distribution cabinet according to an embodiment of this application. Referring to FIG. 8, a plurality of protrusion parts 203 may be arranged at intervals on one substrate 202.

Figure 9:
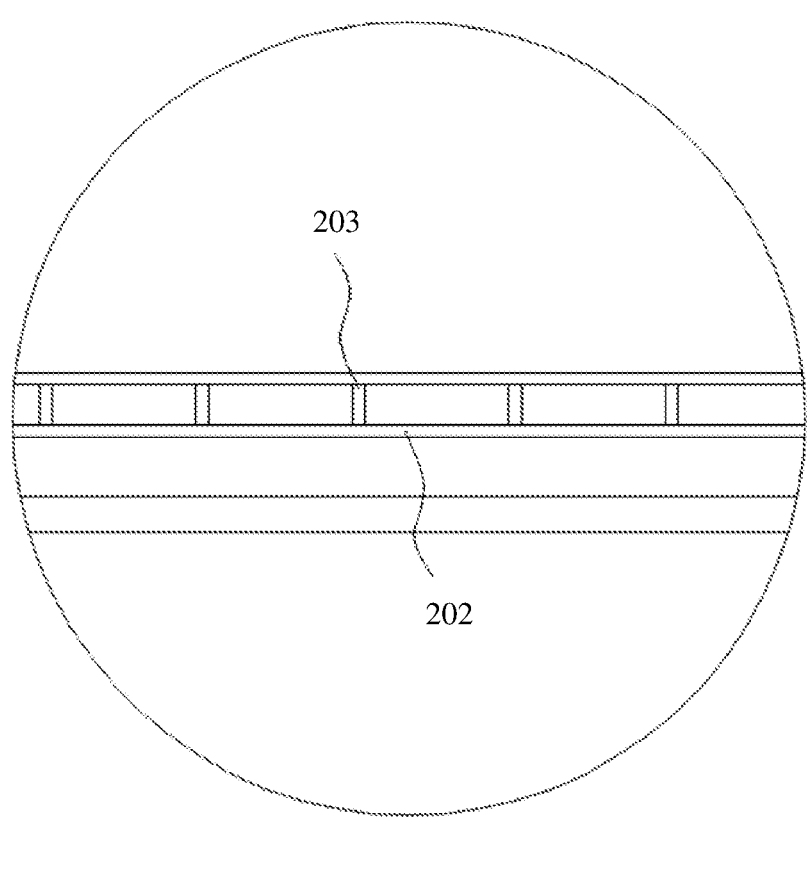
FIG. 9 is still another schematic diagram of a structure of a first air duct assembly of a power distribution cabinet according to an embodiment of this application.

FIG. 9 is still another schematic diagram of a structure of a first air duct assembly of a power distribution cabinet according to an embodiment of this application. Referring to FIG. 9, the protrusion part 203 may be in a plate shape, and the protrusion part 203 in the plate shape may be perpendicular to the substrate 202. Alternatively, there may be an angle between the protrusion part 203 in the plate shape and the substrate 202.

Based on the foregoing description, the protrusion part 203 may be formed first and then connected to the substrate 202, or may be integrally formed with the substrate 202. The plurality of protrusion parts 203 may be of a same structure or different structures. This is not limited in this application.

Figure 10:
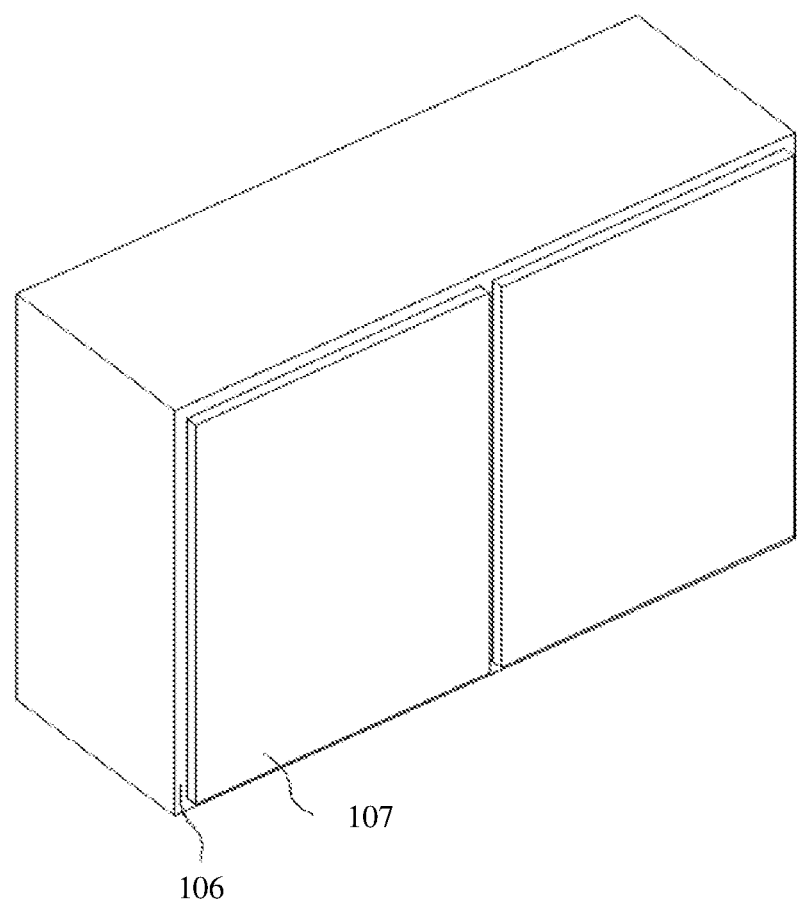
FIG. 10 is a schematic diagram of a structure of a cabinet body of a power distribution cabinet according to an embodiment of this application.

FIG. 10 is a schematic diagram of a structure of a cabinet body of a power distribution cabinet according to an embodiment of this application. Referring to FIG. 10, a door structure 107 or a window structure may be disposed on the third side wall 106 of the cabinet body. In addition, the third side wall 106 may be directly formed by the door or window structure, to facilitate check, maintenance, and the like of a component inside the cabinet body.

Figure 11:
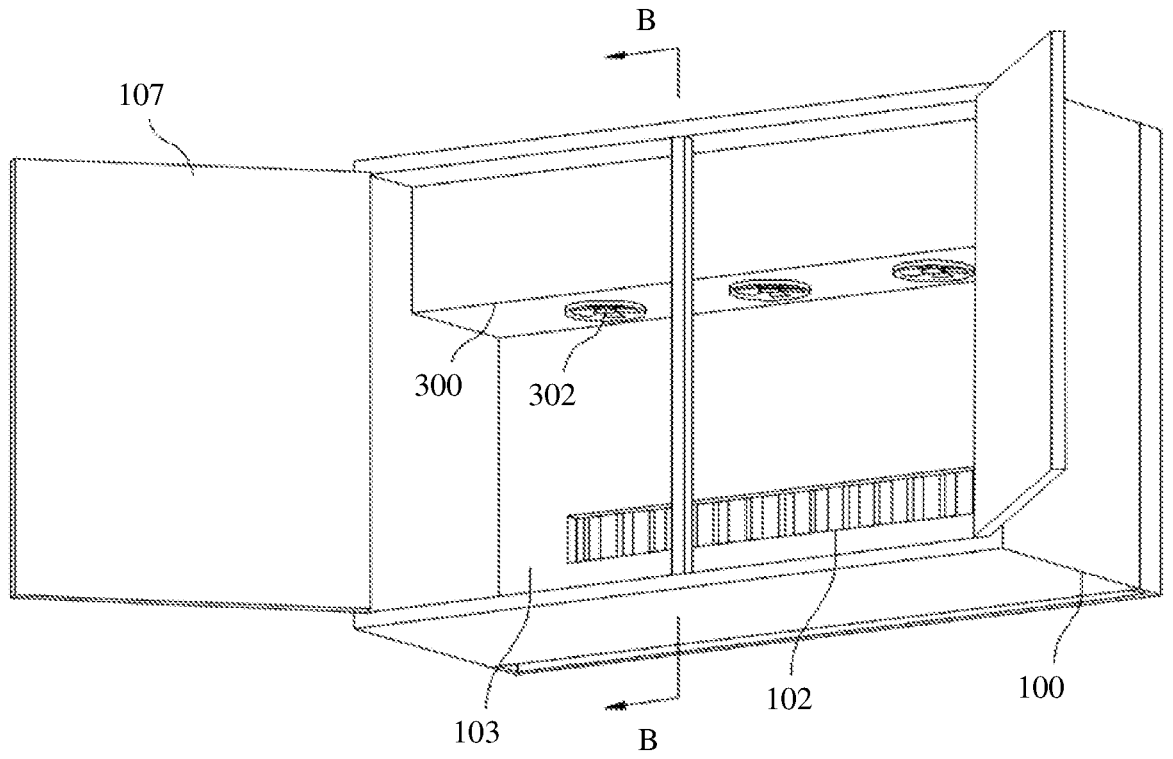
FIG. 11 is a schematic diagram of an internal structure of a power distribution cabinet according to an embodiment of this application.
Figure 12:
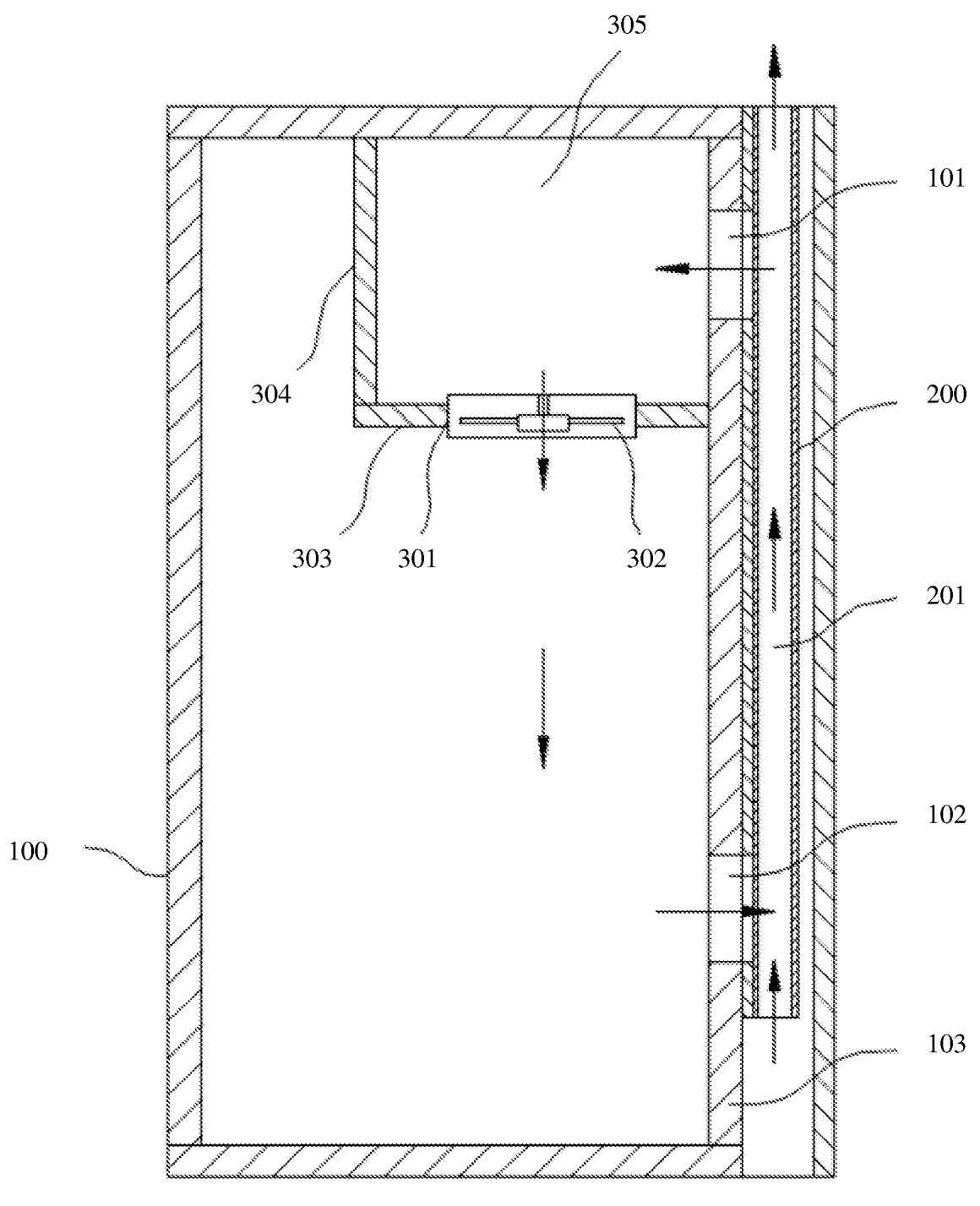
FIG. 12 is a schematic diagram of a section of the power distribution cabinet shown in FIG. 11 along B-B.

FIG. 11 is a schematic diagram of an internal structure of a power distribution cabinet according to an embodiment of this application. In the figure, the door structure 107 is in an open state. FIG. 12 is a schematic diagram of a section of the power distribution cabinet shown in FIG. 11 along B-B. Referring to FIG. 11 and FIG. 12, a second air duct assembly 300 may be disposed in the cabinet body 100. In an exemplary implementation, the second air duct assembly 300 is disposed close to the first air vent 101, and may cover the first air vent 101. The second air duct assembly 300 is provided with a ventilation opening 301, and the internal space of the cabinet body 100 may communicate with the external environment through the ventilation opening 301, the first air vent 101, and the first circulation space 201 in sequence. For example, when the first air vent 101 is disposed close to the top wall of the cabinet body 100, the second air duct assembly 300 may be correspondingly disposed close to the top wall of the cabinet body 100. A cooling fan 302 may be disposed at the ventilation opening 301, to increase an air circulation speed in the internal space of the cabinet body 100, and improve a heat dissipation effect of the component inside the cabinet body 100.

In an exemplary implementation, the second air duct assembly 300 may include a first plate body 303 and a second plate body 304 that are connected to each other, and the first plate body 303 and the second plate body 304 form a second circulation space 305 with an inner wall of the cabinet body 100. When the first air vent 101 is disposed close to the top wall of the cabinet body 100, the first plate body 303 and the second plate body 304 may form the second circulation space 305 together with the first side wall 103 of the cabinet body 100, the side walls on the left and right sides of the first side wall 103, and the top wall through enclosing. The first air vent 101 communicates with the second circulation space 305, that is, the second air duct assembly 300 covers the first air vent 101. During an exemplary implementation, two ends of the first plate body 303 and two ends of the second plate body 304 may be connected to side walls on left and right sides of the cabinet body 100, a first side edge of the first plate body 303 may be connected to the first side wall 103 of the cabinet body 100, a second side edge that is of the first plate body 303 and that is opposite to the first side edge may be connected to a first side edge of the second plate body 304, and a second side edge that is of the second plate body 304 and that is opposite to the first side edge may be connected to the top wall of the cabinet body 100. The first plate body 303 may be horizontally disposed, and the second plate body 304 may be vertically disposed. The ventilation opening 301 may be disposed on the first plate body 303, to blow air from top to bottom inside the cabinet body 100. Alternatively, the ventilation opening 301 may be disposed on the second plate body 304, or the ventilation opening 301 may be disposed on both the first plate body 303 and the second plate body 304. The internal space of the cabinet body 100 may communicate with the second circulation space 305 through the ventilation opening 301, and the second circulation space 305 may communicate with the first circulation space 201 through the first air vent 101, to implement air circulation inside and outside the cabinet body 100. In addition, the second air duct assembly 300 may reduce direct intrusion of external dirt into the cabinet body 100, and may play a role of blocking and temporarily storing the dirt. Compared with an operation of cleaning the internal space of the cabinet body 100, the component in the cabinet body 100, and the like, it is more convenient to regularly clean the second air duct assembly 300, and this is more convenient and time-saving.

In an exemplary implementation, the first plate body 303 may be in a planar shape, a curved surface shape, or another shape, and the second plate body 304 may be in a planar shape, a curved surface shape, or another shape. The first plate body 303 and the second plate body 304 may be disposed perpendicular to each other, or may be disposed at an angle. The first plate body 303 and the second plate body 304 may be integrally formed, are installed on the inner wall of the cabinet body 100 as a whole, and form the second circulation space 305 together with the inner wall of the cabinet body 100 through enclosing.

In some other embodiments, the second air duct assembly 300 may be of a hollow barrel structure with openings at two ends, and in addition to the ventilation opening 301, a vent breather may be disposed on a barrel wall. When the second air duct assembly 300 is installed, the two ends of the second air duct assembly 300 may be respectively connected to the side walls on the left and right sides of the first side wall 103, to jointly form a closed second circulation space 305 through enclosing, and the vent breather communicates with the first air vent 101. It may be understood that a quantity of vent breathers is the same as a quantity of first air vents 101, and a position of the vent breather matches that of the first air vent 101.

Alternatively, the second air duct assembly 300 may be of a hollow barrel structure with two ends closed. Similarly, in addition to the ventilation opening 301, a vent breather is disposed on a barrel wall. A quantity of vent breathers is the same as a quantity of first air vents 101, and a position of the vent breather matches that of the first air vent 101. When the second air duct assembly 300 is installed, the vent breather may communicate with the first air vent 101, and the second air duct assembly 300 may form the second circulation space 305.

In addition, the second air duct assembly 300 may be provided with a plurality of ventilation openings 301, and the plurality of ventilation openings 301 may be disposed at intervals on the second air duct assembly 300 in the horizontal direction. For example, the plurality of ventilation openings 301 may be disposed at intervals on the first plate body 303 in the horizontal direction. Correspondingly, a plurality of cooling fans 302 that are in a one-to-one correspondence with the plurality of ventilation openings 301 may be disposed, and each ventilation opening 301 matches one cooling fan 302. Alternatively, a quantity of cooling fans 302 may be greater than a quantity of ventilation openings 301, and at least one cooling fan 302 may be disposed at one ventilation opening 301, to form a fan wall and increase wind force.

It should be noted that the ventilation opening 301 may be disposed towards a region in which there are a larger quantity of heat generation components inside the cabinet body 100, so that air flow in the region is accelerated, to implement targeted heat dissipation and improve heat dissipation efficiency. A rotation direction of the cooling fan 302 is set, so that the first air vent 101 may be used as an air intake vent, and the second air vent 102 may be used as an air exhaust vent, or the second air vent 102 may be used as an air intake vent, and the first air vent 101 may be used as an air exhaust vent.

With reference to the foregoing description, in the power distribution cabinet in this embodiment of this application, forced air cooling inside the cabinet body 100 may be implemented by using the cooling fan 302, to accelerate air flow inside the cabinet body 100, and quickly bring the hot air inside the cabinet body 100 out of the cabinet body 100 through the second air vent 102. In addition, the first air duct assembly 200 is designed to implement natural convection outside the cabinet body 100, and basically limit natural convection between the hot air flowing out of the cabinet body 100 and the cold air from the external environment to the first circulation space 201, so as to reduce entry of external dust and dirt into the cabinet body 100. In this way, a heat dissipation effect of an internal component can be ensured to resolve a problem of difficulty in heat dissipation in the power distribution cabinet with high heat consumption, and dust intrusion caused due to direct ventilation can be reduced to protect the internal component.

With reference to an air flow direction shown in FIG. 12, when the first air vent 101 is used as an air intake vent and the second air vent 102 is used as an air exhaust vent, the cooling fan 302 introduces air inside the first circulation space 201 into the second circulation space 305 from the first air vent 101 at an upper part, then introduces the air into the cabinet body 100 through the ventilation opening 301, and blows the air in a direction from an upper part to a lower part of the cabinet body 100. Pressure inside the cabinet body 100 increases due to air introduction. In this case, original hot air inside the cabinet body 100 flows out from the second air vent 102 to the first circulation space 201, the hot air rises from the first circulation space 201, and external cold air is replenished into the first circulation space 201 from an end that is of the first air duct assembly 200 and that is close to the bottom wall of the cabinet body 100. The cold air and the hot air are mixed in the first circulation space 201 to perform natural convection and complete heat exchange. A part of mixed air in the first circulation space 201 enters the cabinet body 100 from the first air vent 101, and the other part flows out from an end that is of the first air duct assembly 200 and that is close to the top wall of the cabinet body 100 to the external environment, to quickly dissipate heat generated by the heat generation component such as a copper bar or a circuit breaker in the cabinet body 100 during working, so as to ensure relatively even temperature distribution in the cabinet body 100. In addition, natural convection between the hot air and the cold air is basically performed only in the first circulation space 201, to reduce entry of external dust and dirt into the cabinet body 100. It may be understood that the cooling fan 302 has an air flow introduction function, and therefore the external cold air is also replenished into the first circulation space 201 from the end that is of the first air duct assembly 200 and that is close to the top wall of the cabinet body 100, and is used to perform natural convection with the hot air inside the first circulation space 201. This does not conflict with the foregoing air flow situation.

FIG. 13 is a schematic diagram of an electrical principle of an auxiliary power board of a power distribution cabinet according to an embodiment of this application. As shown in FIG. 13, in an exemplary implementation, the cooling fan may be electrically connected to the direct current busbar of the power distribution cabinet by using an auxiliary circuit board. A DC/DC power supply circuit may be disposed on the auxiliary circuit board, and may directly obtain power from the direct current busbar, and perform voltage isolation and transformation to output a low-voltage direct current, for example, output a 12 V direct current, to supply power to the cooling fan circuit. The auxiliary circuit board is used to implement voltage isolation and transformation. The cooling fan may directly obtain power from the direct current busbar inside the cabinet body, and requires no external power supply. This can lower a requirement of a heat dissipation device on a power supply system, simplify wiring, and lower costs.

In an exemplary implementation, a temperature sensor may be further disposed inside the cabinet body. The temperature sensor may monitor a temperature of an environment and a temperature of the component inside the cabinet body. Based on an actual measurement result or a thermal simulation result, the temperature sensor may be disposed at a position at which there is a representative temperature change inside the cabinet body, for example, a position close to the direct current busbar or a position close to the loop wiring copper bar. A control circuit may be further disposed on the auxiliary circuit board. The control circuit and the temperature sensor may be electrically connected to the DC/DC power supply circuit, and the temperature sensor may be electrically connected to the control circuit. The temperature sensor, the control circuit, and the cooling fan form a temperature control function module. The control circuit receives a detection signal from the temperature sensor, and controls working of the cooling fan based on the detection signal, including controlling starting, stopping, the rotation direction, and a rotation speed of the cooling fan, to implement a temperature control function, ensure that temperature rise of the environment and temperature rise of the component inside the cabinet body fall within an acceptable range, and implement intelligent heat dissipation control.

In some optional embodiments, the DC/DC power supply circuit on the auxiliary circuit board may output a low-voltage direct current, and the control circuit may obtain power from the DC/DC power supply circuit. Therefore, other functional modules that can be implemented through low-voltage power supply may be obtained through expansion on the auxiliary circuit board, and controlled by the control circuit to implement functions. For example, a magnetic door alarm module is obtained through expansion to implement a magnetic door alarm function, and a circuit breaker alarm module is obtained through expansion to implement a circuit breaker alarm function. It may be understood that the magnetic door alarm module and the circuit breaker alarm module may be respectively matched with corresponding control circuits for respective control, and the matched control circuits may obtain power from the DC/DC power supply circuit.

The foregoing descriptions are merely exemplary implementations of this application, but are not intended to limit the protection scope of this application. Any variation or replacement readily figured out by a person skilled in the art within the technical scope disclosed in this application shall fall within the protection scope of this application.

What is claimed is:

1. A power distribution cabinet, comprising:
   a cabinet body, wherein a first air vent and a second air vent are disposed on a first side wall of the cabinet body; wherein the first air vent and the second air vent are disposed at intervals in a vertical direction, and the first air vent is disposed above the second air vent along the vertical direction; and the first air vent is an air inlet, and the second air vent is an air outlet;
   a first air duct assembly, wherein the first air duct assembly is disposed outside the cabinet body, the first air duct assembly is disposed on the first side wall of the cabinet body, a projection of the first air duct assembly on the first side wall covers the first air vent and the second air vent, a first circulation space is formed between the first air duct assembly and the first side wall, the first circulation space communicates with an external environment, and the first circulation space communicates with an internal space of the cabinet body through the first air vent and the second air vent;
   a second air duct assembly, wherein the second air duct assembly is disposed inside the cabinet body, the second air duct assembly forms a second circulation space, the second circulation space communicates with the first air vent to communicate with the first circulation space, the second air duct assembly is provided with a ventilation opening, the second circulation space communicates with the internal space of the cabinet body through the ventilation opening, and a cooling fan is disposed at the ventilation opening, and an air outlet of the cooling fan faces downward in the vertical direction;

a direct current busbar and an auxiliary circuit board electrically connected to the direct current busbar, wherein a temperature sensor is disposed inside the cabinet body, and the temperature sensor is configured to detect a temperature inside the cabinet body; and a direct current (DC)/DC power supply circuit and a control circuit are disposed on the auxiliary circuit board, the DC/DC power supply circuit is configured to: isolate and transform an output voltage of the direct current busbar, and output the output voltage, and the control circuit is electrically connected to the DC/DC power supply circuit, the temperature sensor, and the cooling fan, and is configured to: receive a detection signal from the temperature sensor, and control a rotation speed of the cooling fan based on the detection signal.

2. The power distribution cabinet according to claim 1, wherein the first air duct assembly comprises a substrate and a protrusion part;

the substrate has a first side disposed facing the first side wall; and the protrusion part is disposed on the first side of the substrate, the protrusion part extends in a direction from the first air vent to the second air vent, there are at least two protrusion parts, and the at least two protrusion parts are disposed at intervals.

3. The power distribution cabinet according to claim 2, wherein the protrusion part presses against the first side wall.

4. The power distribution cabinet according to claim 2, wherein there is a gap between the protrusion part and the first side wall.

5. The power distribution cabinet according to claim 2, wherein the protrusion part is in a column shape or an arch shape; or the protrusion part is in a plate shape, and the protrusion part in the plate shape is perpendicular to the substrate.

6. The power distribution cabinet according to claim 1, wherein each of the first air vent and the second air vent is in a strip shape, the second air vent and the first air vent are disposed in parallel, and the first air vent extends in a horizontal direction on the first side wall of the cabinet body.

7. The power distribution cabinet according to claim 1, wherein the second air duct assembly comprises a first plate body and a second plate body that are connected to each other, the first plate body and the second plate body form the second circulation space with an inner wall of the cabinet body, and the ventilation opening is disposed on the first plate body.

8. The power distribution cabinet according to claim 7, wherein the first plate body is horizontally disposed, a first side edge of the first plate body is connected to the first side wall of the cabinet body, the second plate body is connected to a second side edge of the first plate body, and wherein the second side edge is opposite to the first side edge.

9. The power distribution cabinet according to claim 1, further comprising a thermally conductive plate, wherein the thermally conductive plate is disposed on the first side wall, and the thermally conductive plate is located between the first side wall and the first air duct assembly.

10. A direct current power distribution system for energy storage, comprising a power conversion system, a direct current energy storage apparatus, and a power distribution cabinet, wherein the power distribution cabinet comprises:

a cabinet body, wherein a first air vent and a second air vent are disposed on a first side wall of the cabinet body; wherein the first air vent and the second air vent are disposed at intervals in a vertical direction, and the first air vent is disposed above the second air vent along the vertical direction; and the first air vent is an air inlet, and the second air vent is an air outlet;

a first air duct assembly, wherein the first air duct assembly is disposed outside the cabinet body, the first air duct assembly is disposed on the first side wall of the cabinet body, a projection of the first air duct assembly on the first side wall covers the first air vent and the second air vent, a first circulation space is formed between the first air duct assembly and the first side wall, the first circulation space communicates with an external environment, and the first circulation space communicates with an internal space of the cabinet body through the first air vent and the second air vent;

a second air duct assembly, wherein the second air duct assembly is disposed inside the cabinet body, the second air duct assembly forms a second circulation space, the second circulation space communicates with the first air vent to communicate with the first circulation space, the second air duct assembly is provided with a ventilation opening, the second circulation space communicates with the internal space of the cabinet body through the ventilation opening, and a cooling fan is disposed at the ventilation opening, and an air outlet of the cooling fan faces downward in the vertical direction;

a direct current busbar and an auxiliary circuit board electrically connected to the direct current busbar, wherein a temperature sensor is disposed inside the cabinet body, and the temperature sensor is configured to detect a temperature inside the cabinet body; and a direct current (DC)/DC power supply circuit and a control circuit are disposed on the auxiliary circuit board, the DC/DC power supply circuit is configured to: isolate and transform an output voltage of the direct current busbar, and output the output voltage, and the control circuit is electrically connected to the DC/DC power supply circuit, the temperature sensor, and the cooling fan, and is configured to: receive a detection signal from the temperature sensor, and control a rotation speed of the cooling fan based on the detection signal, and wherein the power conversion system is configured to perform alternating current/direct current conversion on electric energy, and the direct current energy storage apparatus is configured to store or release direct current energy; and wherein the power distribution cabinet is connected between the power conversion system and the direct current energy storage apparatus, and is configured to perform current distribution.

11. The direct current power distribution system according to claim 10, wherein the first air duct assembly comprises a substrate and a protrusion part;

the substrate has a first side disposed facing the first side wall; and the protrusion part is disposed on the first side of the substrate, the protrusion part extends in a direction from the first air vent to the second air vent, there are at least two protrusion parts, and the at least two protrusion parts are disposed at intervals.

12. The direct current power distribution system according to claim 11, wherein the protrusion part presses against the first side wall.

13. The direct current power distribution system according to claim 11, wherein there is a gap between the protrusion part and the first side wall.

14. The direct current power distribution system according to claim 11, wherein the protrusion part is in a column shape or an arch shape; or the protrusion part is in a plate shape, and the protrusion part in the plate shape is perpendicular to the substrate.

15. The direct current power distribution system according to claim 10, wherein the first air vent and the second air vent are disposed at intervals in a vertical direction.

16. The direct current power distribution system according to claim 10, wherein each of the first air vent and the second air vent is in a strip shape, the second air vent and the first air vent are disposed in parallel, and the first air vent extends in a horizontal direction on the first side wall of the cabinet body.

17. The direct current power distribution system according to claim 10, wherein the second air duct assembly comprises a first plate body and a second plate body that are connected to each other, the first plate body and the second plate body form the second circulation space with an inner wall of the cabinet body, and the ventilation opening is disposed on the first plate body.

18. The direct current power distribution system according to claim 17, wherein the first plate body is horizontally disposed, a first side edge of the first plate body is connected to the first side wall of the cabinet body, the second plate body is connected to a second side edge of the first plate body, and wherein the second side edge is opposite to the first side edge.

* * * * *